United States Patent
Aokie et al.

(10) Patent No.: US 6,302,706 B1
(45) Date of Patent: Oct. 16, 2001

(54) ELECTRONIC COMPONENT

(75) Inventors: Kouji Aokie; Naotaka Murakami; Hiroki Takata; Osamu Yamato, all of Anjo; Katsuhiko Onoda, Shizuoka, all of (JP)

(73) Assignees: Aisin AW Co., Ltd.; Yazaki Parts Co., Ltd., both of (JP)

( * ) Notice: Subject to any disclaimer, the term of this patent is extended or adjusted under 35 U.S.C. 154(b) by 0 days.

(21) Appl. No.: 09/475,213

(22) Filed: Dec. 29, 1999

(30) Foreign Application Priority Data

Jan. 8, 1999 (JP) .................................................. 11-003402

(51) Int. Cl.$^7$ .................................................. H01R 12/00
(52) U.S. Cl. ......................................... 439/76.1; 361/752
(58) Field of Search .............................. 439/91, 602, 108, 439/109, 62, 249, 76.1; 363/144; 257/777, 784, 686, 779, 778; 361/752, 801, 62

(56) References Cited

U.S. PATENT DOCUMENTS

| 5,748,451 | * | 5/1998 | Thompson et al. | ................... | 439/109 |
| 6,031,590 | * | 2/2000 | Kim | ........................ | 349/86 |
| 6,133,637 | * | 10/2000 | Hikita et al. | ......................... | 257/777 |
| 6,144,571 | * | 11/2000 | Sasaki et al. | ......................... | 363/144 |

FOREIGN PATENT DOCUMENTS

| 4-286147 | * | 12/1985 | (JP) | ..................................... | 439/109 |
| 60-263120 | * | 12/1985 | (JP) | ..................................... | 439/109 |
| 10-257642 | | 9/1998 | (JP). | | |
| 11-273769 | | 10/1999 | (JP). | | |
| 11-297448 | | 10/1999 | (JP). | | |
| 11-297450 | | 10/1999 | (JP). | | |

* cited by examiner

Primary Examiner—Brian Sircus
Assistant Examiner—J. F. Duverne
(74) Attorney, Agent, or Firm—Lorusso & Loud

(57) ABSTRACT

In order to precisely detect positions of respective lead portions of an electronic component and to reduce the cost of production of the electronic component, the electronic component has a resinous pad portion and a plurality of terminal units embedded in the pad portion. Each of the terminal units is provided with lead portions that are disposed parallel to one another with their terminal faces exposed, and junction portions for junction between bonding wires and the lead portions are formed on the terminal faces. Corner portions are formed at predetermined sections on the terminal faces. In this case, even if resin of the pad portion has adhered to the peripheries of the terminal faces and fouled the terminal faces, since the lead portions have the corner portions, images of the lead portions can be detected precisely. Accordingly, the operation of connecting the bonding wires to the terminal faces is performed more efficiently, whereby the cost of production of the electronic component can be reduced.

6 Claims, 7 Drawing Sheets

ELECTRONIC COMPONENT

The disclosure of Japanese Patent Application No. HEI 11-003402 filed on Jan. 8, 1999 including the specification, drawings and abstract is incorporated herein by reference in its entirety.

BACKGROUND OF THE INVENTION

1. Field of the Invention

The present invention relates to an electronic component.

2. Description of the Related Art

In an electronic control unit according to the related art, a casing for accommodating a circuit board is formed integrally with a connector, and a plurality of terminals on the side of the circuit board are connected to a plurality of terminal units on the side of the connector respectively by wire bonding.

Figure 2:
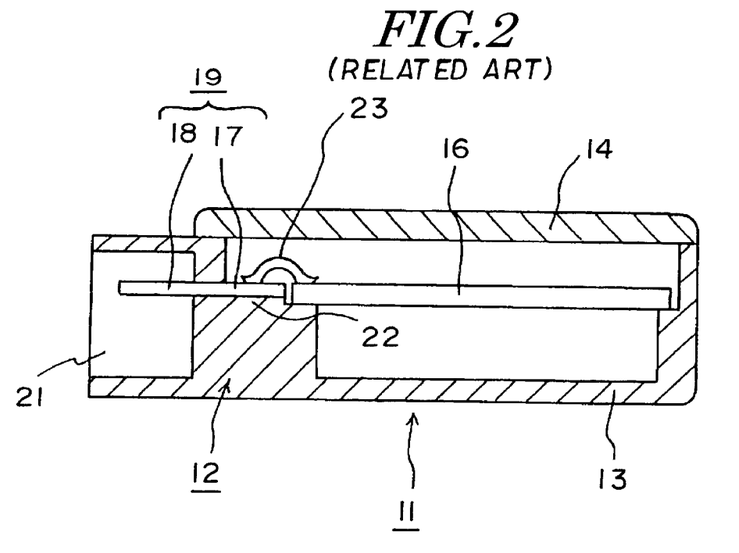
FIG. 2 is a cross-sectional view of an electronic control unit according to the related art.
Figure 3:
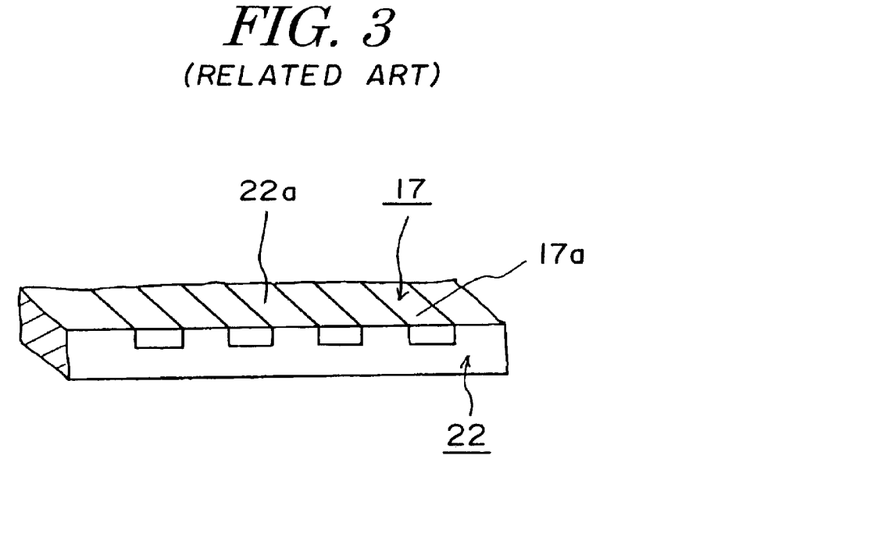
FIG. 3 is a perspective view of an essential part of a pad portion of the electronic control unit according to the related art.

FIG. 2 is a cross-sectional view of an electronic control unit according to the related art. FIG. 3 is a perspective view of an essential part of a pad portion of the electronic control unit according to the related art.

Referring to these drawings, a resinous casing 11 is composed of a body portion 13 with its top face having an opening and a cover 14, and accommodates a circuit board 16. A connector 12 is formed integrally with the casing 11. A plurality of terminal units 19, which are provided with lead portions 17 in the shape of a band plate and with pins 18, are embedded in the connector 12 by insert molding. The terminal units 19 are arranged adjacent to one another and at an equal pitch. In this case, the respective lead portions 17 extend parallel to one another along a top face of a pad portion 22 of the casing 11, that is, along a resinous face 22a. Top faces of the lead portions 17, that is, terminal faces 17a are exposed. The pins 18 protrude into a socket 21 for connecting the connector 12 to a cable (not shown). The casing 11, the connector 12 and the circuit board 16 constitute the electronic control unit.

A plurality of terminals (not shown) formed on the circuit board 16 are electrically connected to the terminal units 19 by wire bonding. For this purpose, bonding wires 23 formed of aluminum wires or the like are caused to oscillate at a high frequency with both ends thereof being pressed against terminals of the circuit board 16 and the lead portions 17 by a bonding tool. As a result, pressure welding sections between the bonding wires 23 at one end and the terminals of the circuit board 16 and pressure welding sections between the bonding wires 23 at the other end and the lead portions 17 are cleared of dirt, oxide film and the like. Thus, the ends of the bonding wires 23 are bonded to the terminals of the circuit board 16 and the lead portions 17 respectively.

However, in an attempt to connect the terminals of the circuit board 16 to the terminal units 19 by wire bonding, it is necessary to press the bonding wires 23 at one end against the lead portions 17 with the aid of the bonding tool. In this case, in order to hold the bonding tool in position, images of the respective lead portions 17 are read, and edge portions, corner portions and the like of the read images are recognized. Then positions of the respective lead portions 17 are detected based on the result of recognition.

However, since resin has adhered to the peripheries of the terminal faces 17a, the edge portions, the corner portions and the like of read images of the respective lead portions 17 cannot be recognized precisely.

Also, since the respective lead portions 17 deviate from their proper locations, it is necessary to read positions of all the lead portions 17. Consequently, in addition to the complication of the overall operation, the cost of production of the electronic control unit goes up.

It is an object of the present invention to provide an electronic component which makes it possible to precisely detect positions of respective lead portions and to lower the cost of production of an electronic control unit, by solving the aforementioned problems of the electronic control unit of the related art.

SUMMARY OF THE INVENTION

Thus, the electronic component has a resinous pad portion and a plurality of terminal units embedded in the pad portion.

Each of the terminal units is provided with lead portions that are disposed parallel to one another with their terminal faces exposed, and junction portions for junction between bonding wires and the lead portions are formed on the terminal faces.

Also, corner portions are formed at predetermined sections on the terminal faces. In this case, each of the corner portions is composed of two line segments. Therefore, when images of the lead portions are read, the corners of the read images can be recognized precisely. Accordingly, positions of the respective lead portions can be detected precisely and easily.

In another electronic component of the present invention, the corner portions formed on the terminal faces are formed by intersection of line segments that are formed by protrusions formed on predetermined sections of the terminal faces of the lead portions with line segments that are formed by the terminal faces. In this case, the corner portions are formed of the line segments formed by the protrusions and the line segments formed by the lead portions. Therefore, when images of the lead portions are read, the corners of the read images can be recognized precisely. Accordingly, positions of the respective lead portions can be detected precisely and easily.

Furthermore, in another electronic component of the present invention, the corner portions formed on the terminal faces are designed such that the terminal faces are offset from a resinous face of the pad portion. In this case, the terminal faces are offset from the resinous face at the corner portions. Therefore, at the portions where the terminal faces are offset from the resinous face, the resin filling the cavity does not adhere to the corner portions and does not foul the terminal faces. Therefore, when images of the lead portions are read, the corner portions of the read images can be recognized precisely. Accordingly, positions of the respective lead portions can be detected precisely and easily.

Further, in another electronic component of the present invention, the corner portions are formed on the terminal faces of those lead portions which are located at both ends in a row of the lead portions. In this case, the corner portions are recognized only as to the lead portions at both ends, and coordinates of the lead portions at both ends are calculated. Thereby it becomes possible to calculate positions of the other lead portions, which are located between the lead portions at both ends. Thus the lead portions can be detected precisely and easily.

BRIEF DESCRIPTION OF THE DRAWINGS

The foregoing and further objects, features and advantages of the present invention will become apparent from the following description of a preferred embodiment with reference to the accompanying drawings, wherein.

DETAILED DESCRIPTION OF PREFERRED EMBODIMENT

An embodiment of the present invention will be described hereinafter with reference to the drawings.

Figure 6:
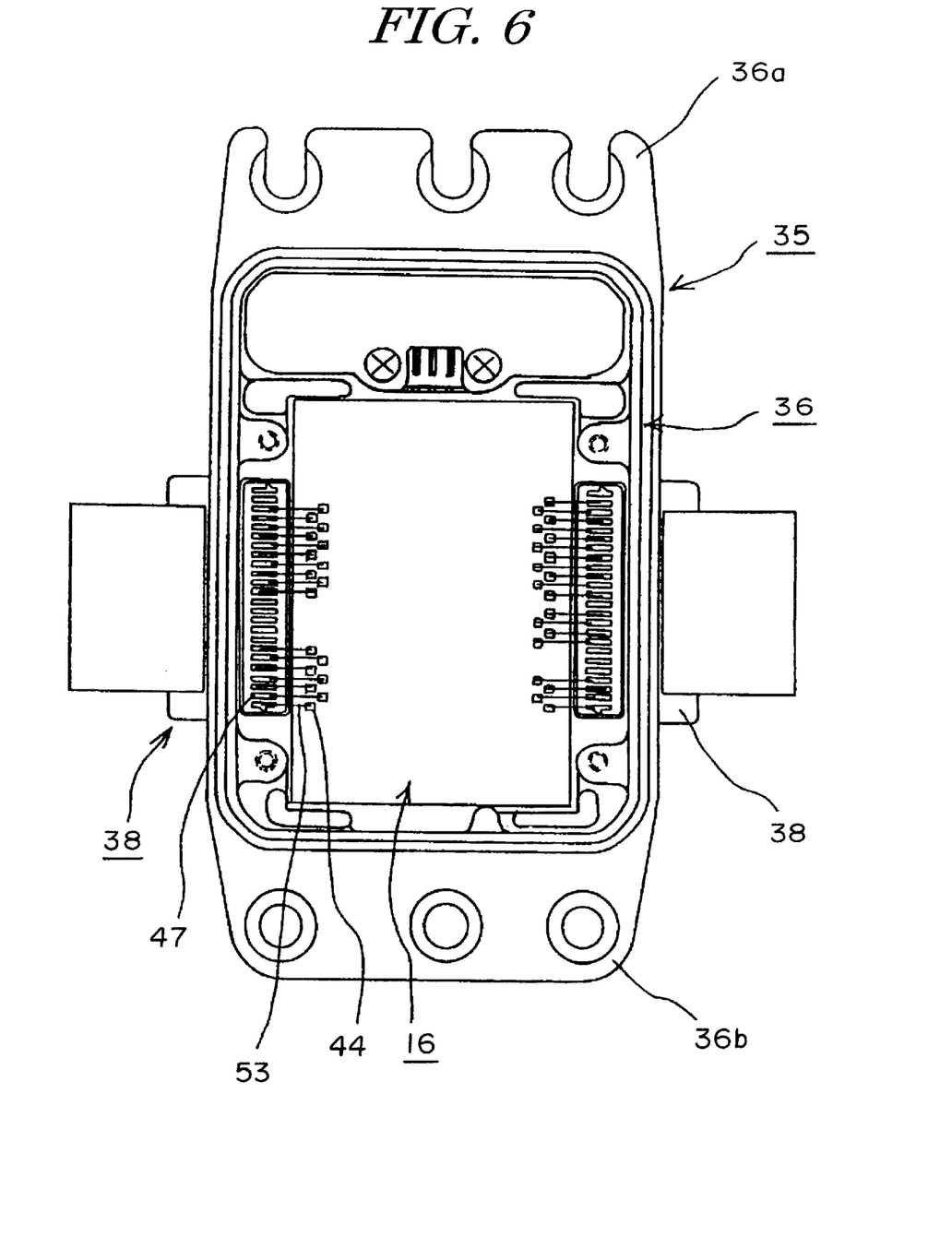
FIG. 6 is a schematic view of an electronic control unit according to the embodiment of the present invention.
Figure 7:
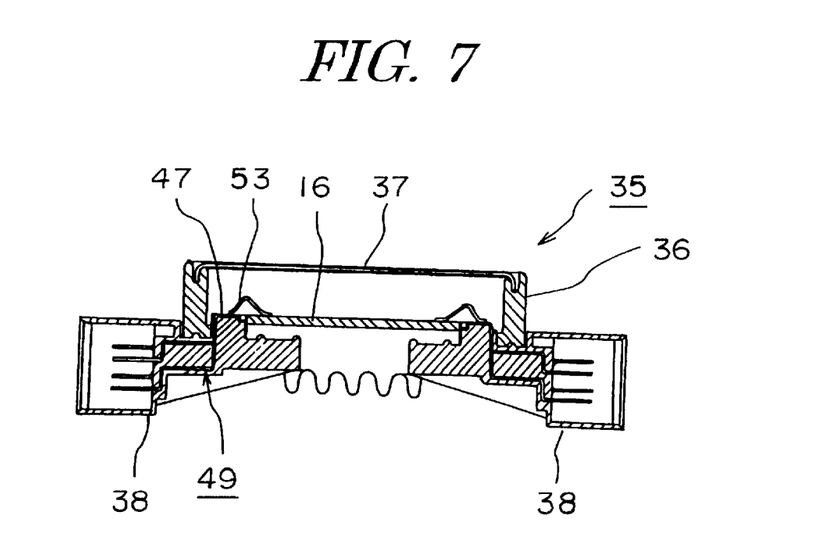
FIG. 7 is a cross-sectional view of the electronic control unit according to the embodiment of the present invention.
Figure 8:
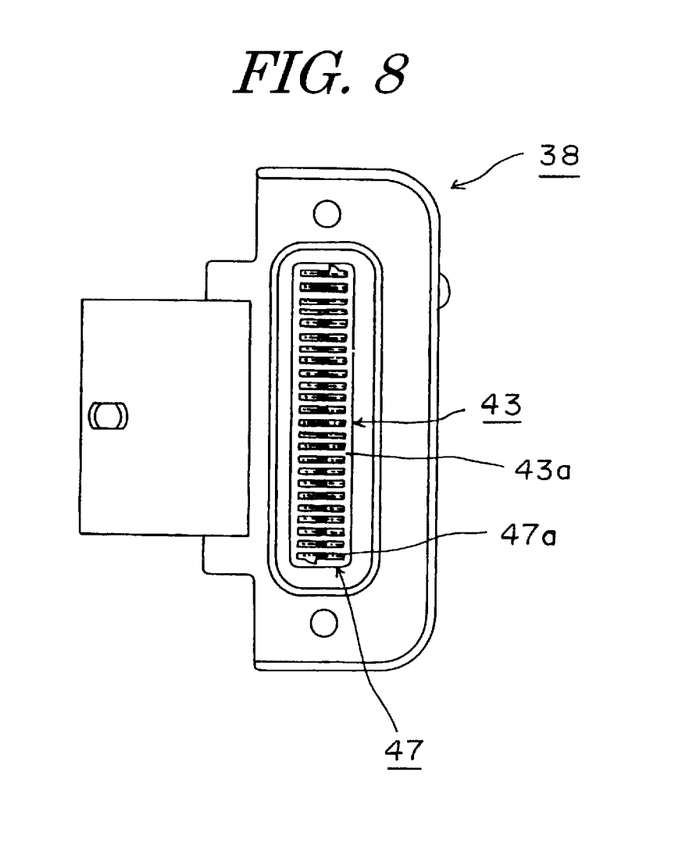
FIG. 8 is a plan view of the connector according to the embodiment of the present invention.
Figure 9:
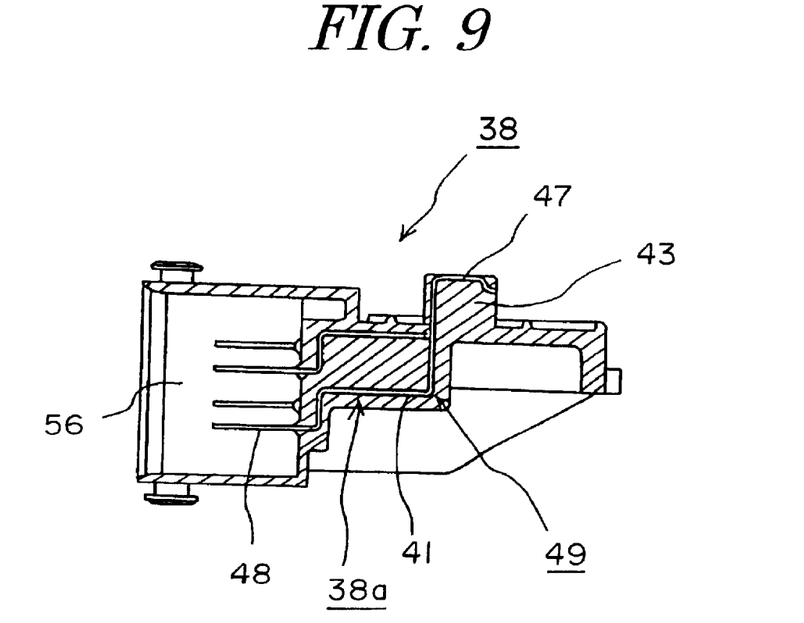
FIG. 9 is a cross-sectional view of the connector according to the embodiment of the present invention.
Figure 10:
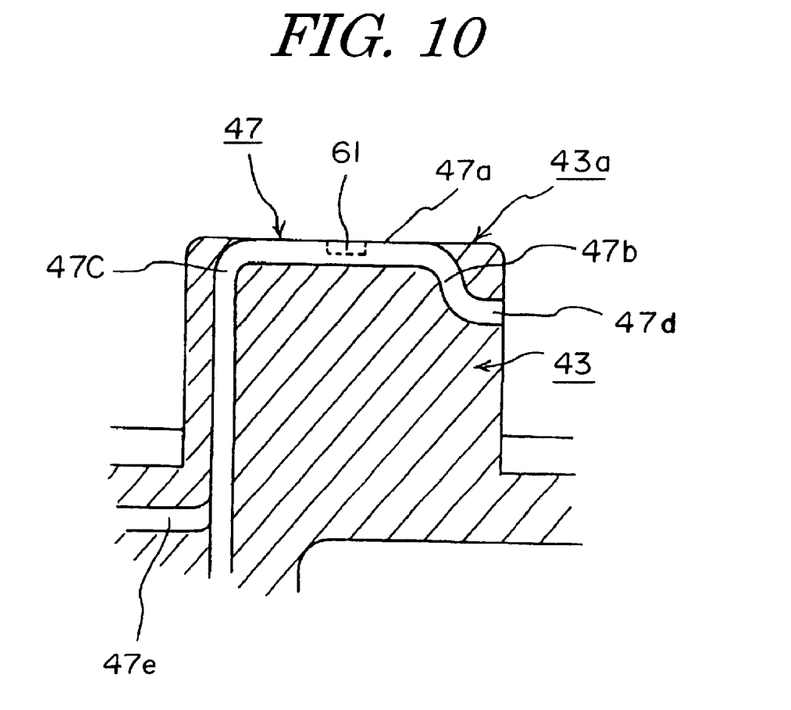
FIG. 10 is a cross-sectional view of an essential part of the connector according to the embodiment of the present invention.

FIG. 6 is a schematic view of an electronic control unit according to the embodiment of the present invention. FIG. 7 is a cross-sectional view of the electronic control unit according to the embodiment of the present invention. FIG. 8 is a plan view of a connector according to the embodiment of the present invention. FIG. 9 is a cross-sectional view of the connector according to the embodiment of the present invention. FIG. 10 is a cross-sectional view of an essential part of the connector according to the embodiment of the present invention.

Referring to these drawings, a resinous casing 35 is composed of a body portion 36 with its top face having an opening and of a cover 37. The body portion 36 is provided with a pair of flanges 36a and 36b for attaching the casing 35 to a suitable part of a vehicle (not shown).

The circuit board 16 is formed by printing a circuit pattern (not shown) onto a ceramic board or the like using a conductor. By arranging a microcomputer, various circuit elements and the like on the circuit board 16, an electronic circuit is formed. A plurality of terminals 44 for sending and receiving various signals and for supplying electric current are formed on both edge portions of the circuit board 16. Connectors 38 are electronic components attached to both edges of the casing 35. Each of the connectors 38 is provided with a resinous body portion 38a. A plurality of terminal units 49, each including a band-shaped lead portion 47, a pin 48 and a coupling portion 41 for connecting the lead portion 47 to the pin 48, are embedded in the body portion 38a by insert molding. The terminal units 49 are arranged adjacent to one another and at an equal pitch. In this case, each lead portion 47 extends parallel to a top face of a pad portion 43 formed on the body portion 38a, that is, parallel to a resinous face 43a. A predetermined section of the lead portion 47 is exposed, thereby forming a top face, that is, a terminal face 47a. The pin 48 protrudes into a socket 56 for connecting the connector 38 to a cable (not shown). At the center between adjacent ones of the lead portions 47, a discontinuous band-shaped groove 61 extending in the longitudinal direction of the pad portion 43 is formed in the resinous face 43a. Several tens of lead portions 47 are arranged in a row in a section of the pad portion 43. Pins 48 are cubically arranged in the socket 56. The casing 35, the connectors 38 and the circuit board 16 constitute the electronic control unit.

Each of the terminals 44 is electrically connected to a corresponding one of the terminal units 49 by wire bonding. For this purpose, bonding wires 53 formed of aluminum wires or the like are caused to oscillate at a high frequency with both ends thereof being pressed against the terminals 44 and the lead portions 47 by a bonding tool (not shown). As a result, pressure welding sections between the bonding wires 53 at one end and the terminals 44 and pressure welding sections between the bonding wires 53 at the other end and the lead portions 47 are cleared of dirt, oxide film and the like. Thus the ends of the bonding wires 53 are bonded to the terminals 44 and the lead portions 47 respectively.

In this case, the pad portion 43 is formed adjacent to each terminal 44 such that one end of each bonding wire 53 is connected to the terminal unit 49 at the shortest distance.

As described above, the terminal face 47a is formed on the predetermined section of the lead portion 47. First embedded portions 47b and 47c, which are bent perpendicularly in the pad portion 43 and extend vertically, are formed on both sides of the section of the lead portion 47 where the terminal face 47a is formed. Leading ends of the first embedded portions 47b and 47c are bent perpendicularly in the pad portion 43, thereby forming second embedded portions 47d and 47e that extend horizontally.

Accordingly, when both the ends of the bonding wire 53 are caused to oscillate at a high frequency by the bonding tool, the lead portion 47 is urged to move lengthwise and crosswise. However, since the first and second embedded portions 47b through 47e are embedded in the resin of the pad portion 43 and the connectors 38 are fixed to the casing 35, the lead portion 47 is prevented from moving. Consequently, it is possible to prevent the high-frequency oscillation of one end of each bonding wire 53 from being damped. Therefore it is possible to connect one end of each bonding wire 53 to the lead portion 47 suitably.

If an external force is applied to the bonding wire 53 after each terminal 44 has been connected to a corresponding one of the terminal units 49 by the bonding wire 53, there is generated a force drawing the lead portion 47 upwards in FIG. 10. However, since the second embedded portions 47d and 47e are embedded in the resin of the pad portion 43, the resin generates a resisting force against the force drawing the lead portion 47 upwards. Accordingly, the lead portion 47 is prevented from being drawn upwards.

The first embedded portions 47b and 47c are formed by being bent by press working. Therefore, the bent sections at the both ends of each lead portion 47 assume a shape of R where resin is adhered. On the other hand, as will be described later, since the grooves 61 are formed on both sides of the central section of each lead portion 47, resin does not adhere to the periphery of the terminal face 47a. Because the lead portion 47 is retained at both ends by resin, even if the central section thereof is not retained by resin, the lead portion 47 can be fixed to the resin reliably.

Next, a production unit of the connector 38 will be described.

Figure 1:
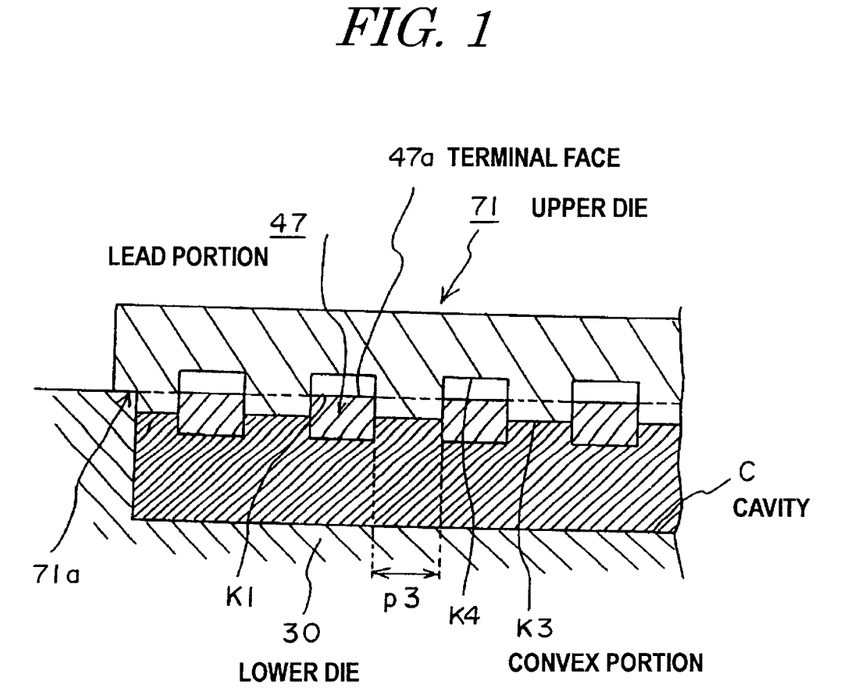
FIG. 1 is a cross-sectional view of a production unit of a connector according to an embodiment of the present invention.
Figure 11:
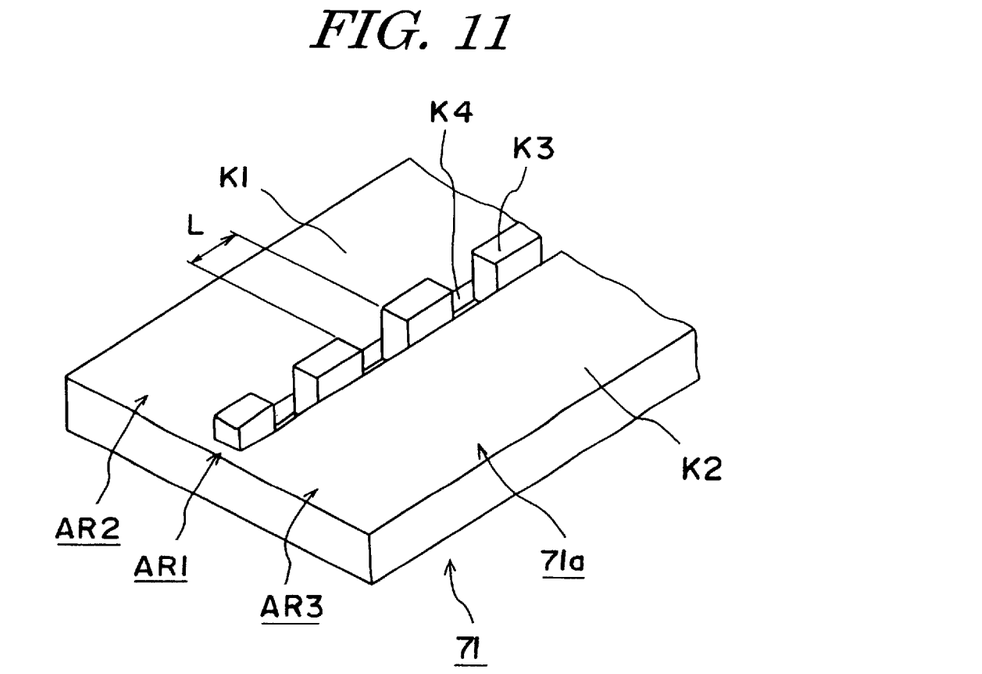
FIG. 11 is a perspective view of an upper die according to the embodiment of the present invention.
Figure 12:
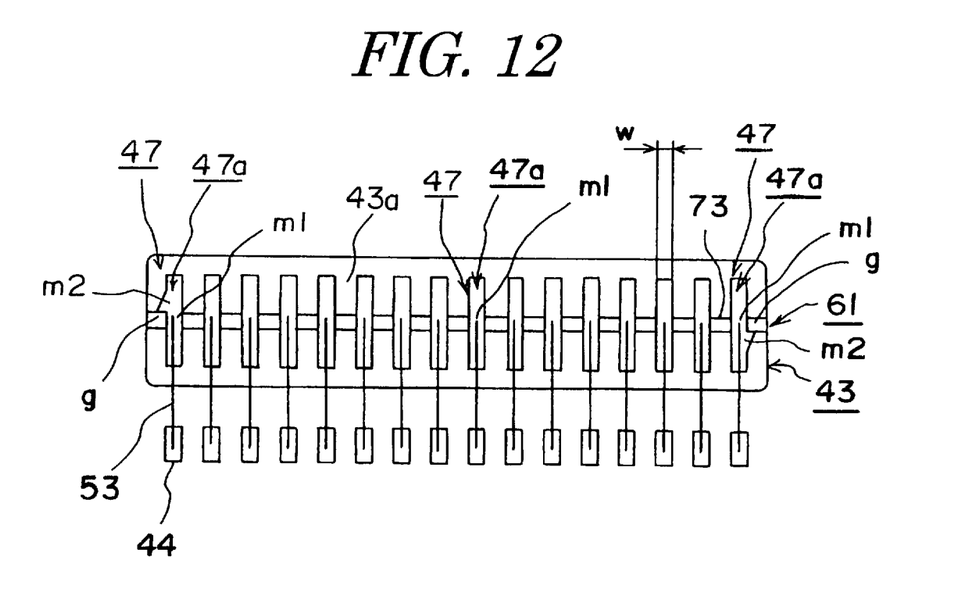
FIG. 12 shows states of terminal faces of lead portions of terminal units according to the embodiment of the present invention.

FIG. 1 is a cross-sectional view of the production unit of the connector according to the embodiment of the present invention. FIG. 11 is a perspective view of an upper die according to the embodiment of the present invention. FIG. 12 shows states of the terminal faces of the lead portions of the terminal units according to the embodiment of the present invention.

Referring to these drawings, a lower die 30 is used as a first die and an upper die 71 is used as a second die. One of the lower die 30 and the upper die 71, for example, the upper die 71 is movably disposed. In this case, a clamping device (not shown) causes the upper die 71 to advance so as to close the dies, applies a clamping force to the upper die 71 so as to clamp the dies, and causes the upper die 71 to retreat so as to open the dies.

Upon closing the dies, there is formed a cavity C to be filled with resin between the upper die 71 and the lower die 30. In the cavity C, the terminal unit 49 (FIG. 9) is retained by a retainer (not shown).

Thus, if the cavity C is filled with fused resin through a gate (not shown) and the resin is then cooled, the connector 38 wherein the terminal unit 49 is embedded in the resin can be obtained.

In this case, the terminal face 47a needs to be exposed above the resinous face 43a. In order to prevent the terminal face 47a from contacting the resin, a first band-shaped area AR1 is set on a face of the upper die 71 that faces the lower die 30, namely, a lower face 71a so as to correspond to the central section of each lead portion 47. A second area AR2 and a third area AR3 are set on opposed sides of the first area AR1. Flat portions K1 and K2 are formed on the second and third areas AR2 and AR3 respectively. When closing the dies, the terminal unit 49 is retained by the retainer such that the flat portions K1 and K2 closely contact the terminal face 47a.

In the first area AR1, a plurality of convex portions K3 are so formed as to protrude from the flat portions KI and K2. A distance L between adjacent ones of the convex portions K3 is equal to a distance p3 between adjacent ones of the respective lead portions 47. In the first area AR1, a concave portion K4 is formed between adjacent ones of the convex portions K3.

Thus, upon closing the dies, each of the convex portions K3 is inserted into a space between adjacent ones of the lead portions 47 of the terminal units 49 retained by the retainers, and each lead portion 47 engages a corresponding one of the convex portions K3. Therefore, even if the lead portions 47 are pressed by a pressure exerted by the resin filling the cavity C, the respective lead portions 47 do not deviate from their proper locations. In other words, the lead portions 47 are arranged at intervals of the equal distance p3. As a result, it is possible to prevent adjacent ones of the lead portions 47 from becoming too close to each other and getting short-circuited.

In the second and third areas AR2 and AR3, the resin filling the cavity C enters a space between the lead portions 47 and the upper die 71 and adheres to the peripheries of the terminal faces 47a, thus fouling the terminal faces 47a. In the first area ARI, however, the convex portion K3 is disposed between adjacent ones of the lead portions 47, and the respective convex portions K3 block up a space between the terminal faces 47a and the cavity C. Therefore, the resin does not adhere to the peripheries of the terminal faces 47a and does not foul the terminal faces 47a. In the pad portion 43, a concave portion 73 is formed between adjacent ones of the lead portions 47, and the terminal faces 47a are offset from the resinous face 43a. The respective concave portions 73 form the grooves 61.

Accordingly, in an attempt to connect the terminal 44 to the terminal unit 49 by wire bonding, if a portion of the terminal face 47a corresponding to the first area AR1 is utilized as a junction portion m1, there is no resin between one end of the bonding wire 53 and the terminal face 47a. Thus, it is possible to prevent the occurrence of junction failure.

Furthermore, in the first area AR1, there is a gap formed between the upper die 71 and each of the terminal faces 47a when the dies are closed. Therefore, it is possible to prevent the terminal faces 47a from being flawed or fouled. Thus the bonding power exerted by wire bonding can be increased.

In an attempt to connect the terminal 44 to the terminal unit 49 by wire bonding, it is necessary to press one end of the bonding wire 53 against the lead portion 47 with the aid of the bonding tool. In this case, a positioning device (not shown) is provided to hold the bonding tool in position.

The positioning device is composed of an image reading portion such as a CCD, an image recognizing portion, and a position-detecting portion. The image reading portion reads an image of the lead portion 47, and the image-recognizing portion recognizes an edge portion, a corner portion and the like of the read image. Based on the result of recognition, the position-detecting portion detects a position of each lead portion 47. In this case, since the respective lead portions 47 do not deviate from their proper locations, there is no need to recognize an edge portion, a corner portion and the like as to all the lead portions 47. Thus, the aforementioned image-recognizing portion is designed to recognize an edge portion, a corner portion and the like only as to the lead portions 47 at both ends. Based on the result of recognition, the position-detecting portion calculates coordinates of positions of the lead portions 47 at both ends. Based on the calculated coordinates, the number of the lead portions 47 and a width w of each lead portion 47, the position-detecting portion calculates coordinates of positions of the respective lead portions 47.

In this case, since no resin adheres to the junction portion m1, when an image of each lead portion 47 is read, it is possible to precisely recognize an edge portion and the like of the junction portion m1 in the read image. Accordingly, the positions of the respective lead portions 47 can be detected precisely and easily.

In this embodiment, in each of the lead portions 47 at both ends, a triangular protrusion is so formed as to be adjacent to the junction portion m1 and to protrude outwards. As shown in FIG. 12, the protrusion m2 forms a corner portion q. At the corner portion q, the terminal face 47a is offset from the resinous face 43a. In this case, the corner portion q is composed of two line segments that are perpendicular to each other. Therefore, the corner portion q can be recognized with much higher precision.

Because there is no need to recognize an edge portion, a corner portion and the like as to all the lead portions 47, the cost of production of the electronic control unit can be lowered in addition to the effect of simplifying the positioning operation.

In this embodiment, in the central portion of the terminal face 47a, the triangular protrusion m2 is so formed as to be adjacent to the junction portion m1 and to protrude outwards, and the corner portion q is so formed as to have a right angle. However, in any portion of the terminal face 47a, a protrusion of any shape can be formed in any direction, and a corner portion having any angle can be formed. In this embodiment, the edge portion, the corner portion q and the like are recognized only as to the lead portions 47 at both ends. However, it is also possible to recognize an edge portion, a corner portion and the like as to any two of the lead portions 47.

Figure 4:
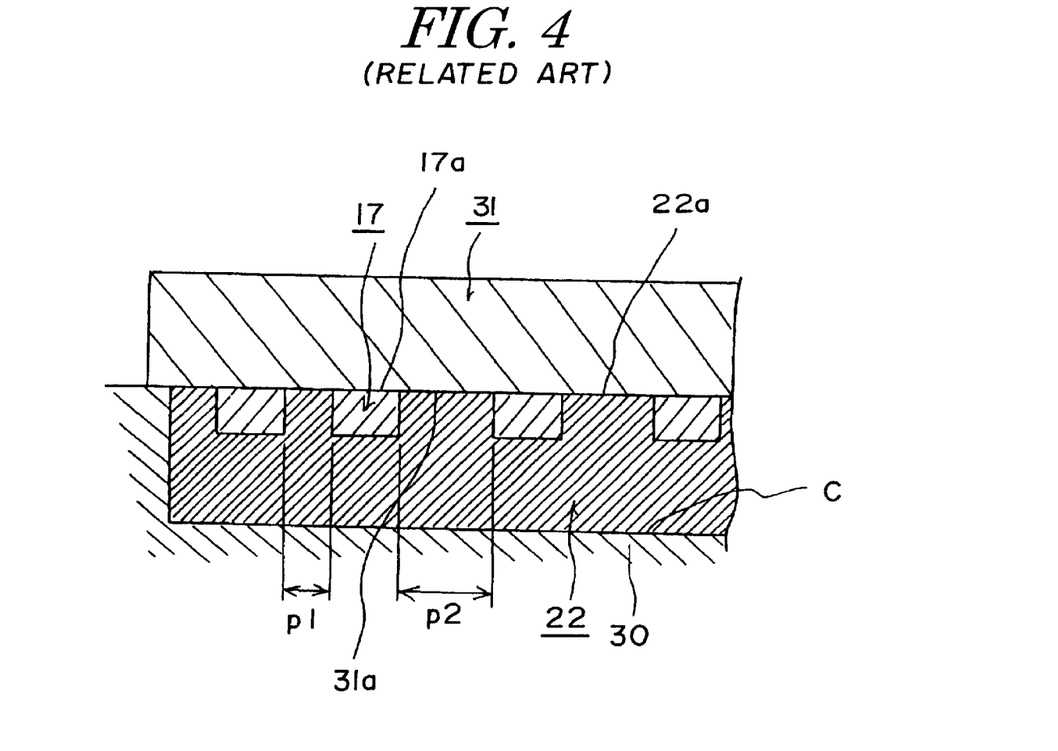
FIG. 4 is a cross-sectional view of a production unit of the electronic control unit according to the related art.
Figure 5:
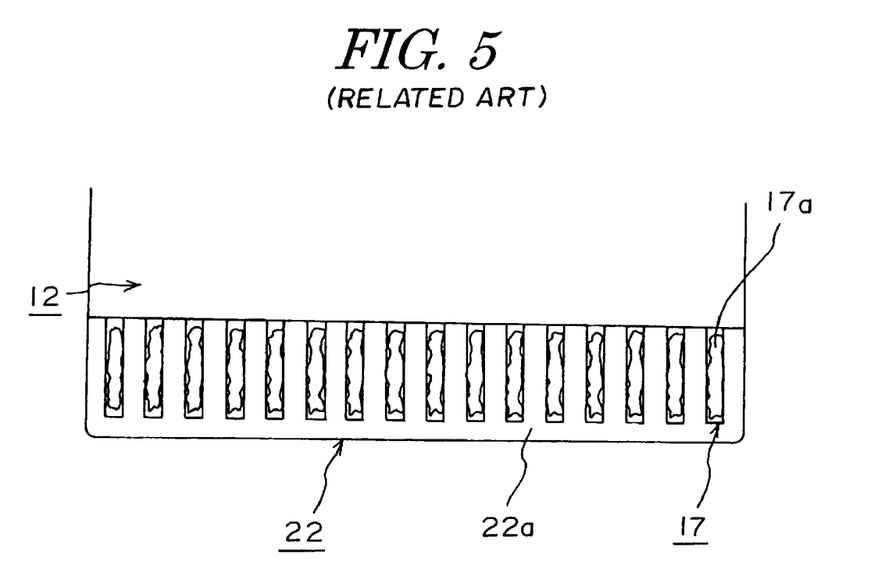
FIG. 5 shows states of terminal faces of lead portions of terminal units according to the related art.

FIG. 4 is a cross-sectional view of a production unit of an electronic control unit according to the related art. FIG. 5 shows states of terminal faces of lead portions of terminal units according to the related art.

Referring to these drawings, a lower die 30 and an upper die 31 are shown. One of the lower die 30 and the upper die 31 is movably disposed. A clamping device (not shown) causes a selected one of the upper and lower dies to advance so as to close the dies, applies a clamping force to the selected die so as to clamp the dies, and causes the selected die to retreat so as to open the dies.

Upon closing the dies, there is formed a cavity C to be filled with resin (not shown) between the upper die 31 and the lower die 30. In the cavity C, a terminal unit 19 (FIG. 2) is retained by a retainer (not shown).

Next, if the cavity C is filled with fused resin through a gate (not shown) and the resin is cooled, a connector 12 wherein the terminal unit 19 is embedded in the resin can be obtained.

In this case, a terminal face 17a needs to be exposed above a resinous face 22a of a pad portion 22. For this purpose, a lower face 31a of the upper die 31 is flattened. When closing the dies, the terminal unit 19 is retained by the retainer such that the lower face 31a closely contacts the terminal face 17a.

However, in the production unit of the electronic control unit according to the related art, the lead portions 17 are pressed by a pressure exerted by the resin filling the cavity C. As a result, the respective lead portions 17 deviate from their proper locations, and the distances p1, p2, between adjacent ones of the lead portions 17 become different from one another.

The resin filling the cavity C enters a space between the lead portions 17 and the upper die 31 and adheres to the peripheries of the terminal faces 17a, thus fouling the terminal faces 17a.

Accordingly, in an attempt to connect the terminal of the circuit board 16 to the terminal unit 19 by wire bonding, if the resin that has adhered to the peripheries of the terminal faces 17a exists between the bonding wire 23 and the lead portions 17, junction failure occurs.

The production unit of the electronic component according to the embodiment of the present invention has the first die, the second die so disposed as to face the first die, the clamping device for causing one of the first and second dies to advance and retreat, and the retainer for retaining a plurality of terminal units in the cavity. The second die is provided with the convex portions that are inserted into the respective lead portions of the terminal units when closing the dies.

In this case, upon closing the dies, each of the convex portions is inserted into a space between adjacent ones of the lead portions of the terminal units retained by the retainers, and each lead portion engages a corresponding one of the convex portions. Therefore, even if the lead portions are pressed by a pressure exerted by the resin filling the cavity, the respective lead portions do not deviate from their proper locations. In other words, the lead portions are arranged at intervals of an equal distance. As a result, it is possible to prevent adjacent ones of the lead portions from becoming too close to each other and getting short-circuited.

Further, the edge portion, the corner portion and the like are recognized only as to the lead portions at both ends, and the coordinates of the lead portions at both ends are calculated. Thereby the coordinates of the other lead portions, which are located between the lead portions at both ends, can be calculated. Therefore, the lead portions can be detected precisely and easily.

Furthermore, there is a gap formed between the second die and each of the terminal faces when the dies are closed. Therefore, it is possible to prevent the terminal faces from being flawed or fouled. Thus the bonding power exerted by wire bonding can be increased.

While the present invention has been described with reference to what is presently considered to be a preferred embodiment thereof, it is to be understood that the present invention is not limited to the disclosed embodiment or constructions. On the contrary, the present invention is intended to cover various modifications and equivalent arrangements. In addition, while the various elements of the disclosed invention are shown in various combinations and configurations, which are exemplary, other combinations and configurations, including more, less or only a single embodiment, are also within the spirit and scope of the present invention.

What is claimed is:

1. An electronic connector for a case housing a circuit board having a plurality of circuit board terminals with bonding wires connected thereto, said electronic connector comprising:

a resin pad portion presenting a resin face;

a plurality of terminal units embedded in the pad portion, each of the terminal units having a lead portion, said lead portions being disposed parallel in an array and presenting exposed terminal faces;

a plurality of pins extending from said pad portion, each pin being connected to one of said lead portions through a coupling portion of one of said terminal units;

junction portions for forming junctions between the bonding wires and the lead portions formed on said terminal faces; and a corner formed as a side protrusion extending from one side of at least one of said terminal faces and defined by intersection of two line segments formed at a location intermediate opposing ends of the one terminal face.

2. The electronic connector according to claim 1 wherein said side protrusion is triangular in shape and coplanar with said terminal faces.

3. The electronic connector according to claim 1, wherein the corner formed on the one terminal face is offset from the resin face of the pad portion.

4. The electronic connector according to claim 1, wherein said corner is formed on the terminal face of only two lead portions which are located at opposing ends of the array of the lead portions.

5. The electronic connector according to claim 2, wherein said corner is formed on the terminal face of only two lead portions which are located at opposing ends of the array of the lead portions.

6. The electronic connector according to claim 3, wherein said corner is formed on the terminal face of only two lead portions which are located at opposing ends of the array of the lead portions.

* * * * *